(12) United States Patent
Sato et al.

(10) Patent No.: US 6,791,257 B1
(45) Date of Patent: Sep. 14, 2004

(54) PHOTOELECTRIC CONVERSION FUNCTIONAL ELEMENT AND PRODUCTION METHOD THEREOF

(75) Inventors: Kenji Sato, Toda (JP); Atsutoshi Arakawa, Toda (JP); Mikio Hanafusa, Toda (JP); Akira Noda, Toda (JP)

(73) Assignee: Japan Energy Corporation, Tokyo (JP)

( * ) Notice: Subject to any disclaimer, the term of this patent is extended or adjusted under 35 U.S.C. 154(b) by 0 days.

(21) Appl. No.: 09/890,774

(22) PCT Filed: Feb. 2, 2000

(86) PCT No.: PCT/JP00/00562

§ 371 (c)(1),
(2), (4) Date: Aug. 3, 2001

(87) PCT Pub. No.: WO00/46862

PCT Pub. Date: Aug. 10, 2000

(30) Foreign Application Priority Data

| Feb. 5, 1999 | (JP) | 11-029138 |
| Feb. 5, 1999 | (JP) | 11-029150 |
| Oct. 1, 1999 | (JP) | 11-282011 |
| Oct. 7, 1999 | (JP) | 11-286567 |
| Oct. 18, 1999 | (JP) | 11-295007 |
| Oct. 26, 1999 | (JP) | 11-304228 |
| Nov. 1, 1999 | (JP) | 11-311279 |

(51) Int. Cl.$^7$ ............................. H01J 1/62; H01J 63/04
(52) U.S. Cl. ..................... 313/498; 313/499; 313/501; 313/506; 257/78; 257/101; 438/45; 438/95; 427/66; 445/23; 445/24
(58) Field of Search ................................ 313/498, 499, 313/501, 506; 257/78, 101, 102, 103; 438/45, 95, 919; 445/23, 24; 427/66

(56) References Cited

U.S. PATENT DOCUMENTS 3,576,586 A * 4/1971 Ross ........................... 347/225

(List continued on next page.)

FOREIGN PATENT DOCUMENTS

JP  4934267  9/1974

(List continued on next page.)

OTHER PUBLICATIONS

Iodko et al., Materials Science Forum, vols. 182–194, pp. 353–358 (1995).

(List continued on next page.)

Primary Examiner—Nimeshkumar D. Patel
Assistant Examiner—Kevin Quarterman
(74) Attorney, Agent, or Firm—Birch, Stewart, Kolasch & Birch, LLP

(57) ABSTRACT

An electro luminescence device comprises a compound semiconductor crystal substrate comprising a Group 12 (2B) element and a Group 16 (6B) element in a periodic table. It is produced by providing a substrate having a low dislocation density or a low inclusion density; forming a pn junction by thermally diffusing an element converting the substrate of a first conduction type into the one of a second conduction type from a front surface of the substrate; and forming electrodes on front and rear of the substrate. A diffusion source including an element converting the substrate of a first conduction type into the one of a second conduction type is disposed on the front surface of the substrate, preventing forming of a defect compensating an impurity level which is formed in the substrate by the element during a diffusion process, and gettering impurity on the front surface of the substrate by the diffusion source. Thereby, the conduction type of the Group II–VI compound semiconductor can be controlled and the electro luminescence device having superior light emission characteristics can be stably produced.

33 Claims, 3 Drawing Sheets

U.S. PATENT DOCUMENTS

| | | | | |
|---|---|---|---|---|
| 4,295,148 | A | * 10/1981 | Marine et al. | 257/78 |
| 5,548,137 | A | * 8/1996 | Fan et al. | 257/191 |
| 6,011,271 | A | * 1/2000 | Sakuma et al. | 257/14 |

FOREIGN PATENT DOCUMENTS

| | | |
|---|---|---|
| JP | 52144988 | 12/1977 |
| JP | A54130890 | 10/1979 |
| JP | A577171 | 1/1982 |
| JP | A59172279 | 9/1984 |
| JP | A61268079 | 11/1986 |
| JP | A1169933 | 7/1989 |
| JP | A294672 | 4/1990 |
| JP | A3283578 | 12/1991 |
| JP | A6224473 | 8/1994 |
| JP | A7118098 | 5/1995 |
| JP | 8222524 | 8/1996 |
| JP | A9255499 | 9/1997 |
| JP | B2-2839027 | 10/1998 |

OTHER PUBLICATIONS

Saji et al., Al Diffusion in ZnTe Single Crystals and ZnTe Junction, pp. 452–459 (1979).

Watanabe, Japanese Journal of Applied Physics, vol. 5, No. 1, pp. 12–18 (1966).

Marine et al., Applied Physics Letters, pp. 352–354 (1970).

Bensahel et al., Journal of Luminesence, vol. 18/19, pp. 762–766 (1979).

* cited by examiner

PHOTOELECTRIC CONVERSION FUNCTIONAL ELEMENT AND PRODUCTION METHOD THEREOF

This application is the national phase under 35 U.S.C. § 371 of PCT International Application No. PCT/JP00/00562 which has an International filing date of Feb. 2, 2000, which designated the United States of America and was not published in English.

TECHNICAL FIELD

The present invention relates to a useful technique applied to an electro luminescence device and a method for producing the same, such as a LED (light emitting diode) or a LD (laser diode) produced by employing a compound semiconductor crystal substrate comprising a Group 12 (2B) element and a Group 16 (6B) element in the periodic table.

BACKGROUND ART

With compound semiconductors that comprise a Group 12 (2B) element and a Group 16 (6B) element in the periodic table (hereinafter, that are referred to Group II–VI compound semiconductors), generally, free control of conduction types of p-type and n-type is difficult except CdTe (cadmium telluride). Thus, extremely a few electro luminescence devices provided with these materials and methods for producing the same are made practicable, and the ranges thereof remain limited.

For example, with a method for fabricating a light emitting diode as an electro luminescence device by using a ZnSe system material, a large number of mixed crystal thin films of ZnSe system are formed on a GaAs substrate by a molecular beam epitaxial growth method, thereafter electrodes are formed, and then a pn junction type light emitting diode is fabricated.

When fabricating the light emitting diode, with the ZnSe system material, since the control for a p-type semiconductor is difficult in a thermal equilibrium state, the epitaxial growth method which is not in the thermal equilibrium state was applied to formation of the mixed crystal thin films by using a particular apparatus which is referred to as a radical gas source.

As an electro luminescence device provided with such a ZnSe system material, for example, 480 nm blue LEDs are manufactured by way of trial. Furthermore, fabrication of blue LDs in quantum well structure of CdZnSe—ZnSe is reported, and it draws attention as a blue light emitting device.

However, as above-described, with the electro luminescence device provided with the Group II–VI compound semiconductor, the material system is extremely limited because the physical property that the control of conduction types in the Group II–VI compound semiconductor is difficult. Thus, the electro luminescence device having the Group II–VI compound semiconductor has not bean put to practical use except for the ZnSe system materials.

When the electro luminescence device provided with the ZnSe system material was fabricated, the epitaxial growth method was required to be applied to the fabrication, to make control of the conduction types possible. Thus, there were problems that the productivity was low, and that the production cost increased because an expensive apparatus such as the radical gas source or the like was required.

Then, the inventors or the like proposed a method for forming an electro luminescence device by using the Group II–VI compound semiconductor single crystal substrate, and forming a pn junction by thermally diffusing a diffusion source including an element converting the substrate of a first conduction type into one of a second conduction type from a front surface of the substrate.

However, there was a problem that the characteristics of the electro luminescence device fabricated by the method depended heavily on quality of the used substrate, and thus the electro luminescence device having superior light emission efficiency was not stably fabricated.

The present invention was developed to solve the above-described problems. A main object of the present invention is to provide a method that is capable of stably producing an electro luminescence device having superior light emission efficiency by using a Group II–VI compound semiconductor crystal substrate.

DISCLOSURE OF THE INVENTION

At first, the inventors investigated depositing diffusion sources over ZnTe substrates of compound semiconductors (Group II–VI compound semiconductors) comprising Group 12 (2B) elements and Group 16 (6B) elements in the periodic table and being produced by some producing methods, and then formed pn junctions by thermally diffusing the diffusion sources. Thereafter, the inventors investigated the correlation between the light emission characteristics and the qualities of the substrate (particularly, crystal dislocation).

As a result, green light emission was able to be recognized from light emitting diodes produced by using substrates on which density of pits (hereinafter, it referred to as etch pits), which were obtained by etching with high temperature sodium hydroxide aqueous solution, was not more than $20,000/cm^2$, preferably not more than $10,000/cm^2$, more preferably not more than $5,000/cm^2$, furthermore, not more than $2,000/cm^2$ On the other hand, with light emitting diodes produced by using substrates on which the density of the etch pits exceeded $20,000/cm^2$, no light emission was able to be recognized.

It was verified that the etch pits formed using sodium hydroxide occurred due to the dislocation in the crystal by another experiment. Therefore, with the ZnTe substrate, the dislocation density and etch pit density can be treated equally.

From the result of the above-described researches, it was ascertained that the light emitting phenomenon of the light emitting diode depends largely on the dislocation density or the etch pit density of the front surface of the substrate.

It has been known that a large number of inclusions exist inside of crystals of the Group II–VI compound semiconductor depending upon growth methods or growth conditions. For example, the Group II–VI compound semiconductor, which is applied to a substrate for a visible light emitting diode, has wide forbidden band width and is transparent. Thus, the inclusions inside the substrate can be observed by an optical microscope.

Thus p-type ZnTe substrates that were different from each other in densities of inclusions were prepared. Then, as a diffusion source, for example, Al or In was deposited over the front surfaces of the substrates, and pn junctions were formed by the thermal diffusion. The characteristics of the light emitting diodes formed by such a method were compared with one another. When the density of the inclusions having grain diameters of 0.3 to 10 μm on the pn junction interfaces, which were observed in a focal field of the optical microscope of ×100 to ×200 magnification, was not more than 100,000/cm$^2$, preferably not more than 50,000/cm$^2$, it was possible to obtain the light emitting diodes having a little leakage current due to recombination and superior light emission efficiency.

On the other hand, when the density of the inclusions exceeded 100,000/cm$^2$, the light emission efficiency decreased. In particular, in the substrate having inclusions which were larger than 5 μm, even if the density of the inclusions was in single figure smaller 10,000 to 50,000/cm$^2$, it was found that the leakage current increased and the light emission efficiency lowered.

Consequently, it is considered that the leakage current occurs because the inclusions in the pn junction interface form current passages.

Therefore, it is supposed that suppression of the inclusions in the pn junction interfaces plays a role for decreasing the leakage current and thus improving light emission efficiency.

From a result of observation by a scanning electron microscope, the number of the inclusions existed in the interface is generally smaller than the number of the inclusions observed by the optical microscope.

This depends on the sizes of the inclusions. When the sizes of the inclusions are about 1 μm, the density of the inclusions in the interface and the density of the inclusions observed by the optical microscope are at the same level, while when the sizes of the inclusions are small, the density of the inclusions in the interface is about in single figure small compared with the density of the inclusions observed by the optical microscope.

Then, as a result of the researches, when the number of the inclusions existed in the junction interface was not more than 50,000/cm$^2$, it was possible to obtain the electro luminescence device in which the leakage current due to the recombination is small and having superior efficiency.

The first invention according to the present inventions was developed based on the above-described findings, and is an electro luminescence device comprising a compound semiconductor crystal substrate comprising a Group 12 (2B) element and a Group 16 (6B) element in a periodic table, wherein the electro luminescence device is produced by providing a substrate having a low defect density, and forming a pn junction in the vicinity of a front surface of the substrate by thermally diffusing an element converting the substrate of a first conduction type into the one of a second conduction type from the front surface of the substrate.

According to the invention, the leakage current due to the recombination can be reduced, and the electro luminescence device (for example, light emitting diode which emits green light) having high light emission efficiency can be stably obtained.

When the conduction type of the substrate (first conduction type) is p-type, the element thermally diffused is impurity (donor) converting the substrate into the one of n-type, while when the conduction type of the substrate is n-type, the element thermally diffused is impurity (acceptor) converting the substrate into the one of p-type.

As the substrate, the one on which density of pits obtained by etching with sodium hydroxide aqueous solution at 90 to 130° C. is not more than 20,000/cm$^2$, more preferably not more than 10,000/cm$^2$, particularly preferably not more than 5,000/cm$^2$, furthermore, not more than 2,000/cm$^2$, may be used.

With a ZnTe substrate, the dislocation density and the density of etch pits occurred due to the sodium hydroxide can be treated equally. Thus, as the substrate, the one on which the dislocation density is not more than 20,000/cm$^2$, more preferably not more than 10,000/cm$^2$, particularly preferably not more than 5,000/cm$^2$, furthermore, not more than 2,000/cm$^2$, may be used. Alternatively, because the density of the etch pits occurred when etching the substrate correlates with the dislocation density in the substrate, density of etch pits occurred by other etchants may be used as a condition.

As the substrate, the one in which the density of the inclusions having grain diameters of 0.3 to 10 μm in the pn junction interfaces and being able to be observed in a focal field of the optical microscope of ×100 to ×200 magnification is not more than 100,000/cm$^2$, may be used.

Furthermore, the substrate may be made of any one of ZnTe, ZnSe and ZnO.

According to the means, the electro luminescence device can be obtained wherein the wavelengths of the light emitted from the opposite light emitting regions sandwiching an interface of the pn junction are different from each other.

More concretely, with the electro luminescence device produced by providing a p-type ZnTe as the substrate, and using Al, Ga, In, or alloy including them as the diffusion source including an element converting the substrate of the first conduction type into the one of the second conduction type, the light emitted from the light emitting region in a side of the diffusion source is from green light to red light having a wavelength of from 550 to 700 nm, while the light emitted from the light emitting region in a side of the substrate is from yellow light to red light having a wavelength of from 580 to 700 nm. The light emitting regions sandwich the interface of the pn junction.

Details are shown in Table 1.

TABLE 1

| Diffusion source | Light emission from a light emitting region in a side of the diffusion source | Light emission from a light emitting region in a side of the substrate |
|---|---|---|
| Al or alloy including it | Green light to orange light having wavelength of 550 to 630 nm | Yellow light to orange light having wavelength of 580 to 630 nm |
| In or alloy including it | Green light to red light having wavelength of 550 to 700 nm | Orange light to red light having wavelength of 610 to 700 nm |
| Ga or alloy including it | Green light to orange light having wavelength of 550 to 660 nm | Orange light to red light having wavelength of 610 to 660 nm |

Furthermore, the inventors made repeated investigations into a method for controlling the conduction type of the Group II–VI compound semiconductor. Then, it was reasoned that when the impurities are doped into the crystal by diffusion, if the formation of vacancies can be controlled at the diffusion step, the effect of selfcompensation may be suppressed and efficient control of the conduction type may be possible.

As a result of repeated investigations based on the reasoning, the fruits were obtained as follows. That is, when diffusion source is disposed on a front surface of a Group II–VI compound semiconductor substrate of a first conduction type, the diffusion source including an element converting the substrate into one of a second conduction type, and then is thermally diffused, it can prevent that the highly volatile constitute element in the substrate is come off from the front surface of the substrate during the diffusion step, so that it is possible to prevent vacancies from forming.

As regards impurities remaining on the front surface of the substrate, it was found that when a compound of the element included in the diffusion source and the impurities is more stable at the diffusion temperature than a compound of the element constituting the substrate and the impurities, the impurities can be removed from the front surface of the substrate, so that it gives the effect of improving the purity of the front surface of the substrate.

Then, based on the fruits of the investigations, the experiment was carried out using Al or In (which may be in the form of impurities wherein a p-type ZnTe substrate is converted into one of n-type. The Al or In was deposited under vacuum on a front surface of the substrate to form Al or In thin film, and then heat treatment was carried out under $N_2$ atmosphere.

As a result, it was found that the deposited Al or In can prevent the highly volatile Zn from vaporizing from the front surface of the substrate, giving the effect of suppressing formation of vacancies in the substrate.

Further, since Al or In forms a stable compound with impurities, such as oxygen or the like, in the ZnTe substrate, it is expected that Al or In removes the impurities from a front surface layer of the substrate to improve the purity of the front surface of the substrate.

Then, ohmic electrodes were formed on both surfaces of the substrate into which Al or In was thermally diffused, thereby a light emitting diode as an electro luminescence device was manufactured by way of trial. This light emitting diode showed rectifying characteristics, so that it was possible to recognize the light emission. The formation of pn junction by the method for thermally diffusing Al or In was also verified with EBIC method (Electron Beam Induced Current Method).

Accordingly, it was proved that this method is effective for forming a pn junction of the Group II–VI compound semiconductor.

As a result of comparing between cases that Al and In are used as the diffusion sources, it was found that when Al is used, the light emission color is nearer to green compared with the case that In is used. Furthermore, it was found that when In is used, red light emission is mixed. This red light emission is considered to be the light emission caused mainly by oxygen impurities. That is, it is known that the oxygen taken in the crystal enters in a Te lattice site location and emits light in red. It is considered that the oxygen exits in the crystal in the form bonded with Zn.

Al and In are strongly bonded with oxygen, and Gibbs' free energy thereof are −1,690 kJ/mol and −635 kJ/mol, respectively, at an anneal temperature of around 600° C. The Gibbs' free energy of them is small and stable compared with the Gibbs' free energy of ZnO (−260 kJ/mol). Furthermore, because oxide of Al is more stable than oxide of In, Al has a large effect on gettering oxygen from the ZnTe substrate. Thus, the red light emission resulted from oxygen was not generated.

C, Si, Bi or the like, of which oxide has small free energy, can be expected to have the same effect.

As impurities having luminescence peak on the side of a long wavelength in the Group II–VI compound semiconductor, Au, Ag, Cu, Li or the like are given other than oxygen.

Since compounds of Au, Ag and Cu and halogens, such as Cl or the like, are more stable than compounds of Au, Ag and Cu and Zn, these impurities can be removed from the substrate in the diffusion step by using diffusion sources including halogens.

With regard to the heat treating temperature of the diffusion step, as a result of various experiments at the temperature range of from 300° C. to 700° C., it was found that more uniform diffusion was possible in a low temperature region, and the heat treatment in the range of 300 to 430° C. was preferable.

As a result of various experiments in which the heat treatment time was changed in the range of from few minutes to tens of hours, the heat treatment time might be enough if it was not less than the defined time for Al and In, respectively. However, when the diffusion source did not remain on the front surface of the substrate at the end of the diffusion step, it was found that excellent current/voltage characteristics was not obtained, and no light emission was generated in many cases.

The reason of this is considered that when the diffusion source did not remain on the front surface of the substrate with an enough thickness at the end of the diffusion, the diffusion source did not enable sufficient suppression of the evaporation of Zn and thus of the formations of defects, such as vacancies or the like in the substrate. Also, it is considered that gettering impurities, such as oxygen or the like, in the substrate by the diffusion source was not sufficient. Therefore, it was found that remaining of the diffusion source of enough thickness on the front surface of the substrate at the end of the diffusion was important.

The second invention according to the present inventions was developed based on the above-described findings, and is a method for producing an electro luminescence device, comprising the steps of: providing a compound semiconductor crystal substrate comprising a Group 12 (2B) element and a Group 16 (6B) element in a periodic table; forming a pn junction in the vicinity of a front surface of the substrate by thermally diffusing diffusion source including an element converting the substrate of a first conduction type into the one of a second conduction type; and forming electrodes on both surfaces of the substrate; wherein the diffusion source is disposed on the front surface of the substrate, preventing forming of a defect compensating an impurity level which is formed in the substrate by the element included in the diffusion source during a diffusion step, and furthermore the diffusion source includes an element gettering impurity on the front surface of the substrate.

According to the method, the controllability for conduction type of the Group II–VI compound semiconductor can be improved efficiently by suppressing the effect of self-compensation and the purity of the front surface of the substrate can also be improved. Thus, the electro luminescence device having superior light emission efficiency can be obtained.

When the conduction type of the substrate (first conduction type) is p-type, the element included in the diffusion source is impurity (donor) converting the substrate into one of n-type, while when the conduction type of the substrate is n-type, the element included in the diffusion source is impurity (acceptor) converting the substrate into one of p-type.

The defect compensating a level showing the conduction type (the second conduction type) which is different from the conduction type (the first conduction type) of the substrate may include a vacancy or a defect including the vacancy.

Furthermore, the diffusion source may comprise such a material that the Gibbs' free energy of a compound which is formed by combining the diffusion source and impurity in the substrate may be smaller than the Gibbs' free energy of a compound which is formed by combining the constitute element in the substrate and the impurity at the diffusion temperature.

Alternatively, the diffusion source may comprise such an element that the Gibbs' free energy of a compound which is formed by combining an element included in the diffusion source and impurity in the substrate may be smaller than the Gibbs' free energy of a compound which is formed by combining the constitute element in the substrate and the impurity at the diffusion temperature.

The impurity in the substrate is at least one of O, Li, Ag, Cu and Au.

As the diffusion source, Al, Ga, In, or alloy thereof, or Cl, Br, I, or alloy thereof may be used.

The element included in the diffusion source and gettering the impurity in the substrate may comprise an element having a slow diffusion rate into the substrate compared with the element converting the substrate of the first conduction type into one of the second conduction type.

The element included in the diffusion source and gettering the impurity in the substrate may be at least one of B, Si and C.

The diffusion source may be deposited over the front surface of the substrate by any one of a sputtering method, a resistance heating method, and an electron beam method, under vacuum.

The heat treating temperature at the diffusion may be 300° C. to 700° C., preferably.

The diffusion source may be formed in the film thickness of 1,000 to 10,000 Å, preferably, 1,500 to 5,000 Å.

It may be preferable that the diffusion source may remain on the front surface of the substrate with a predetermined thickness after the diffusion.

The diffusion source may be remained in the thickness of not less than 100 Å, preferably, not less than 300 Å after the diffusion.

Preferably, when the diffusion source is Al or In, the diffusion time may be longer than the time specified by a relational expression $Y=2\times10^5\exp(-0.018\ T)$, showing the relation between the diffusion time Y and the heat treating temperature T.

Preferably, the substrate may be ZnTe.

Furthermore, the inventors investigated about light emission characteristics of the electro luminescence device, and found that the light emission characteristics depends strongly on plane orientation of the substrate on which the diffusion source is disposed.

Then, the electro luminescence devices were fabricated by disposing the diffusion sources on various plane orientations of the substrates, and experiments were carried out repeatedly.

Specifically, ZnTe crystal, which is one of the Group II–VI compound semiconductor single crystal, was sliced at various plane orientations, and substrates were obtained. Then, the diffusion source of Al was deposited over the front surface of the substrate and the pn junction was formed by the thermal diffusion. Thereafter, electrodes were provided on both surfaces of the substrates, so that the electro luminescence devices were fabricated. The light emission characteristics of these specimens were investigated.

As a result, with the specimens each of which a substrate plane is the one other than (111)Te plane, the light emission was recognized from almost whole planes of the substrates, while from the specimen of which a substrate plane is the (111)Te plane, only weak light emission was recognized.

For finding out the reason, the (111)Te plane and other planes were compared with each other. As a result, plane roughness was occurred in the (111)Te plane after etching of the substrate. On the other hand, no plane roughness was occurred in (111)Zn plane, (001) plane, and (011) plane other than the (111)Te plane after etching.

When Al as the diffusion source was deposited over the front surface in which the plane roughness was occurred, adhesiveness between Al and the front surface of the substrate was poor. Accordingly, it is considered that the thermal diffusion into the substrate was only locally occurred. Actually, a phenomenon of easily peeling of the diffusion source deposited over the (111)Te plane was observed.

The condition of the diffusion was investigated inplane. As a result, with the specimen of which substrate plane was the (111)Te plane, diffusion depth was not uniform but varied largely. Further, many non-diffused portions were observed. On the other hand, with the specimens of which substrate planes were the one other than the (111)Te plane, it was found that the diffusion sources were almost uniformly diffused.

Accordingly, a finding was obtained that plane roughness in the front surface of the substrate causes the ununiformity of diffusion to deteriorate the light emission characteristics. Therefore, it came to a conclusion that for obtaining excellent light emission characteristics, carrying out the etching at least in a condition that no plane roughness is occurred is important.

Consequently, although various etchants for causing no plane roughness were tried, no suitable etchant for the (111)Te plane was found.

On the other hand, it was confirmed that etching the planes other than the (111)Te plane by etchants, such as hydrobromic acid or Br-methanol system, enables obtaining relatively flat surface-condition.

With the substrates of which substrate planes were inclined within 10 degrees from the (111)Zn plane, (001) plane, or (011) plane, flat surfaces without plane roughness were able to be obtained by etching with the etchants, such as hydrobromic acid or Br-methanol system.

The third invention according to the present inventions was developed based on the above-described findings, and is a method for producing an electro luminescence device, comprising the steps of: providing a compound semiconductor crystal substrate comprising a Group 12 (2B) element and a Group 16 (6B) element in a periodic table; disposing a diffusion source on a front surface of the substrate, the diffusion source including an element converting the substrate of a first conduction type into the one of a second conduction type; forming a pn junction in the vicinity of the front surface of the substrate by thermally diffusing the diffusion source; and forming electrodes on both surfaces of the substrate; wherein the diffusion source is disposed on a substrate plane having plane orientation from which a flat plane is obtained after etching.

According to the invention, avoiding the influence of the plane orientation on the light emission characteristics by limiting the plane orientation of the substrate, the electro luminescence device having superior light emission efficiency can be stably produced.

The substrate may be one of ZnTe, ZnSe, and ZnO, preferably.

When the substrate of which substrate plane is (111)Zn plane, (001) plane, or (011) plane is employed, flat plane may be obtained after etching.

Alternatively, when the substrate of which substrate plane inclines within 10 degrees from the (111)Zn plane, (001) plane, or (011) plane is employed, flat plane may also be obtained after etching.

In addition, before the diffusion source is disposed, the front surface of the substrate may be chemically etched. At this time, the etching by etchant of bromic acid system or bromine system may be preferable.

The inventors further investigated repeatedly for the producing method of electro luminescence device. As a result, it was found that when the diffusion process was performed for relatively long times (it is required for the diffusion source to remain after diffusion process) at a low temperature (300 to 550° C.), the elements constituting the diffusion source were uniformly diffused, so that the light emission characteristics became stable.

Then, based on inference that if the condition of diffusion process is the same, the light emission characteristics obtained through the diffusion source after the diffusion should be due to the diffusion source, experiments were repeatedly carried out for determining the most suitable deposition conditions of the diffusion source for more stable light emission characteristics.

The condition of the diffusion process is 16 hours at 420° C. With the experiments, for the substrate, p-type ZnTe substrate, which is one of the Group II–VI compound semiconductors, was employed, and Al was employed for the diffusion source.

At first, a thin film of the Al diffusion source was formed on the ZnTe substrate by vacuum deposition with a thickness of 5 nm, 10 nm, 20 nm, 50 nm, 100 nm, 200 nm or 500 nm. Thereafter, diffusion process was performed for 16 hours at 420° C. to thereby form the pn junction. At this time, after the diffusion process under the diffusion conditions, respective diffusion sources with respective thickness remained on the substrates. Thereafter, electrode was formed on the side of the rear surface of the ZnTe substrate, so that the light emitting diode was produced. Then, the correlation between the thickness of the deposited diffusion source and the light emission characteristics of light observed through the diffusion source was investigated.

As a result, it was found that when the film thickness of the deposited diffusion source was 5 to 50 nm, the light observed through the Al diffusion source was green light having high light emission intensity and being stable, while when the film thickness of the deposited diffusion source exceeded 50 nm, the yellow light became stronger than the green light in the relative intensity, and the light emission intensity lowered as a whole.

From this findings, the inventors considered that the luminescence center of yellow is due to defects caused by excess Al. That is, the inventors inferred that as the film thickness of the Al diffusion source increases, the concentration of Al diffusing into the ZnTe substrate increases, thereby the defects caused by Al increases in the ZnTe substrate, so that the intensity of the yellow luminescence increases.

Then, investigations were repeatedly carried out based on the above-described inference. As a result, producing the electro luminescence device having superior light emission characteristics was achieved by limiting properly the film thickness of the diffusion source.

The inventors further investigated about diffusion length of the diffusion source into the substrate and the light emission characteristics of the obtained electro luminescence device. Then, it was found that when the Al diffusion source remains on the ZnTe substrate, the diffusion length depends strongly on the condition of the diffusion process, while it is little influenced by the film thickness of the Al diffusion source. Accordingly, it is considered that if the conditions of the diffusion process are the same, the diffusion lengths of Al become the same, thereby the light emission intensities become the same when the light emitted from the pn junctions reaches the interface between the substrate and the diffusion source.

However, the light emission intensities obtained through the Al diffusion source differed with the film thicknesses of the Al diffusion source. As a result of further repeated investigations, it was found that since transmittance of the Al diffusion source varies with the film thickness of the Al diffusion source, the intensity of the light obtained trough the Al diffusion source varies. Then, when thinning the film thickness of the diffusion source for the light easily to transmit, the green luminescence with high light emission-intensity and stable was obtained.

As described above, when the film thickness of the diffusion source to be deposited was thinned, the light transmittance of the diffusion source remained after diffusion process became extremely high. Thus, without forming new transparent electrode by removing the diffusion source after diffusion process, it was possible to improve the efficiency of taking light out by employing the diffusion source for an electrode.

The fourth invention according to the present inventions was developed based on the above-described findings, and is a method for producing an electro luminescence device, comprising the steps of: providing a compound semiconductor crystal substrate comprising a Group 12 (2B) element and a Group 16 (6B) element in a periodic table; disposing a diffusion source on a front surface of the substrate, the diffusion source including an element converting the substrate of a first conduction type into the one of a second conduction type; forming a pn junction in the vicinity of the front surface of the substrate by thermally diffusing the diffusion source; and forming electrodes on both surfaces of the substrate; wherein the diffusion source is disposed on the front surface of the substrate in a film thickness of from 5 nm to 50 nm.

Accordingly, since an amount (concentration) of the diffusion source diffused into the substrate can be controlled, it is possible to prevent the light emission characteristics from changing caused by the defects formed in the substrate, the defects being due to the diffusion source. Therefore, an electro luminescence device having superior light emission characteristics can be produced.

Particularly, with the diffusion source, the film thickness of 5 to 20 nm may be more efficient. With this thickness, the diffusion source remained on the front surface of the substrate after the diffusion process may become thin for enough light transmittance, so that the intensity of the light transmitting the diffusion source may become high. Thus, without forming a transparent electrode, such as ITO or the like, the electro luminescence device having superior light take out efficiency may be produced with easy processes and in relatively low cost.

Preferably, the processing temperature for the diffusion may be 300 to 550° C. Further, it is preferable that the processing time for the diffusion may be determined so that the diffusion source will remain in a predetermined thickness after the diffusion process, for example, in a thickness of 3 to 15 nm.

Preferably, the substrate may be ZnTe, ZnSe or ZnO. Further, the diffusion source may be Al, Ga, In, or alloy thereof.

Next, the inventors or the like researched relation between the light emission intensity of the electro luminescence device and PL (photoluminescence) intensity of the substrate before the diffusion source is diffused, and found out that there is a strong correlation between both. Accordingly, it was found out that when the electro luminescence device is produced by employing a substrate having high PL intensity, the electro luminescence device having superior light emission characteristics can be obtained.

It was further found out that the PL intensity of the substrate before the diffusion depends strongly on carrier density in the substrate.

Then, for determining the optimum carrier density for high PL intensity of the substrate before the diffusion, investigations about relation between the PL intensity of the substrate before the diffusion and the carrier density were repeatedly carried out.

Concretely, dopant of predetermined amount was doped into the Group II–VI compound semiconductor single crystal substrates, so that substrates having carrier densities of $7 \times 10^{16}$ to $7 \times 10^{18}$ $cm^{-3}$ were fabricated. Then, the PL intensity of each substrate was measured, and the relation of the PL intensity to the carrier density of the substrate was investigated. The result is shown in FIG. 4. It is understood from FIG. 4 that the PL intensity does not increase in proportion to the carrier density, but decreases when the carrier density is not less than a value. Furthermore, from the above-described finding, it is inferred that when the substrate having the carrier density within a range of $1 \times 10^{17}$ to $5 \times 10^{18}$ $cm^{-3}$, the electro luminescence device having high light emission intensity can be obtained.

Then, the inventors carried out the following experiments for confirming the above-described inference.

At first, a substrate having carrier density of $7 \times 10^{16}$ to $7 \times 10^{18}$ $cm^{-3}$ was employed, and the diffusion source was deposited over the front surface of the substrate and thermally diffused, so that the pn junction was formed. Thereafter, an ohmic electrode was formed on the rear surface of the substrate, so that the electro luminescence device was fabricated. The light emission characteristics thereof was investigated.

As a result, it was verified that the electro luminescence device fabricated by employing the substrate having carrier density of $1 \times 10^{17}$ to $5 \times 10^{18} cm^{-3}$ emitted green light with high intensity. Further, the electro luminescence device fabricated by employing the substrate having carrier density of $3 \times 10^{17}$ to $2 \times 10^{18}$ $cm^{-3}$ emitted stable green light with high intensity. Furthermore, the electro luminescence device fabricated by employing the substrate having carrier density of $5 \times 10^{17}$ to $9 \times 10^{17}$ $cm^{-3}$ emitted stable green light with higher intensity.

On the other hand, with the electro luminescence device fabricated by employing the substrate having carrier density of less than $1 \times 10^{17}$ $cm^{-3}$ or more than $5 \times 10^{18}$ $cm^{-3}$, it was verified that the light emission intensity was lower than that of the electro luminescence device fabricated by employing the substrate having carrier density of $1 \times 10^{17}$ to $5 \times 10^{18}$ $cm^{-3}$.

The fifth invention according to the present inventions was developed based on the above-described findings, and is an electro luminescence device comprising a compound semiconductor crystal substrate comprising a Group 12 (2B) element and a Group 16 (6B) element in a periodic table, wherein the electro luminescence device is produced by disposing a diffusion source including an element converting the substrate of a first conduction type into the one of a second conduction type on a front surface of the substrate; forming a pn junction in the vicinity of the front surface of the substrate by thermally diffusing the diffusion source; and forming electrodes on both surfaces of the substrate, and wherein the substrate has carrier density of from $1 \times 10^{17}$ $cm^{-3}$ to $5 \times 10^{18}$ $cm^{-3}$.

Preferably, the substrate may be ZnTe, ZnSe or ZnO. Further, the diffusion source may be Al, Ga, In, or alloy thereof. The substrate may have the desired carrier density by doping determined amount of the Group 15 (5B) element, for example, phosphorus in the periodic table.

Furthermore, the inventors investigated the light emission characteristics of the electro luminescence device. As a result, it was found that most emitted light was absorbed around the front surface of the substrate, so that the light emitted to outside became considerably weak.

One of causes of this is inferred that the ZnTe, ZnSe, ZnO or the like constituting the substrate is a direct transition type. That is, for example, with the ZnTe, an absorption coefficient a for light at 550 nm in band edge luminescence is up to $1 \times 10^4$/cm. As light damps to 1/e (e=2.73) per a thickness of 1 $\mu$m, the emitted light damps exponentially with increasing the thickness of the substrate through which the light passes. Therefore, with the electro luminescence device in which the band edge luminescence is employed, the light should be taken out of the front surface of the substrate before the light damping.

Further investigations were carried out about the above-described point. As a result, a conclusion can be obtained that for increasing the light emission intensity of the electro luminescence device, the diffusion depth is required to fall in a range, in which the light with desired intensity can be taken out.

Then, employing the p-type ZnTe as a substrate, experiments were carried out for determining the optimum diffusion depth when Al was used as the diffusion source.

At first, the Al as the diffusion source was deposited over the p-type ZnTe substrate, and thermally diffused, so that a pn junction was formed. Then, electrodes were formed on front and rear of the substrate, so that the light emitting diode was fabricated. The light emitting diode was evaluated by an EBIC (Electron beam induced current) method. As a result, as shown in a graph in FIG. 5, it was found that the carrier density of the dopant was approximately the same as or slightly lower than the carrier density of the substrate. In addition, it was found that a diffusion length of minority carrier was short, about 0.2 to 0.3 $\mu$m.

According to the above-described result, it is supposed that a thickness of a depletion layer formed from the junction portion to an n-type layer may be 0.1 to 0.7 $\mu$m within the optimum carrier density of the substrate. For taking out the light emission from the front surface of the substrate, the light emission being caused by recombination of minority carrier and from the edge of the depletion layer, it is considered that forming a length from the light emitting region to the front surface within 1/a (a is the absorption coefficient) is at least required.

That is, in a case of ZnTe, 1/a is 1 $\mu$m, and it was found that forming the junction interface in a range of 0.3 to 2 $\mu$m is most suitable, considering the depletion layer width and the diffusion length. As a result of experiments, when the diffusion length (diffusion depth) exceeded 2.0 $\mu$m from the front surface, little green light emission was observed, while when it was below 0.3 μm, leakage current increased and green-color was locally observed. Accordingly, the efficiency of the diffusion length of 0.3 to 2.0 μm was able to be verified. A position of the junction interface can be confirmed by observing a cleavage surface of the substrate by SEM (secondary electron microscope) and with light and shade of the SEM image.

The sixth invention according to the present inventions was developed based on the above-described findings, and is an electro luminescence device comprising a compound semiconductor crystal substrate comprising a Group 12 (2B) element and a Group 16 (6B) element in a periodic table, wherein the electro luminescence device is produced by disposing a diffusion source including an element converting the substrate of a first conduction type into the one of a second conduction type on a front surface of the substrate; forming a pn junction in the vicinity of the front surface by thermally diffusing the diffusion source; and forming electrodes on both surfaces of the substrate, and wherein a depth of the diffusion is not less than 0.3 μm and not more than 2.0 μm from the front surface of the substrate.

Since the diffusion depth is limited as described above, the damping caused by the light absorption is reduced, and thereby the light emission intensity can be increased.

Preferably, the substrate may be ZnTe, ZnSe or ZnO. Further, the diffusion source may be Al, Ga, In, or alloy thereof.

According to the above-described means, the electro luminescence device of which a luminescence center wavelength is 550 nm to 570 nm can be obtained.

Next, the inventors or the like cut the light emitting diode into chips of determined size, packaged them with resin or the like, and evaluated the current-voltage characteristics (I–V characteristics) of the packaged light emitting diodes by applying forward current. As a result, it was found that there was much current flowing in a low voltage region or current flowing in reverse bias (leakage current), and the light emission efficiency was not so good.

Then, as a result of consideration for investigating of the causes, it was inferred that since the thermal diffusion is carried out such that the diffusion source is deposited over the entire front surface of the substrate, the pn junction interface is exposed to a cutting plane when the substrate is cut into chips, and process deterioration in the pn junction interface influences the increasing of the leakage current.

That is, it was considered that although a dicing saw is used for cutting the substrate into chips, the pn junction interface, which is exposed to the cutting plane, deteriorates in the cutting process by the dicing saw, thus the leakage current increases. Generally, it is often the cases that a way of etching the cutting plane is applied to removal of the processing deteriorated layer in the pn junction interface. However, in the case of the ZnTe substrate, there is no etchant for efficiently removing Te. Thus, because Te remained on the cross section after etching, it was difficult to sufficiently reduce the leakage current.

Therefore, a method other than the etching is required to reduce the leakage current. The inventors or the like investigated in more detail the causes of the occurrence of the leakage current, and as a result, found out that the leakage current at issue flowed through the pn junction interface in the cutting plane.

According to the result of the investigation, it was inferred that if the pn interface does not exist in the cutting plane of the substrate, it may be possible to control the leakage current after etching. Based on the inference, the diffusion source was deposited only on the portions other than portions to be cut, and the diffusion was performed, thereby the light emitting diode was manufactured by way of trial. The portions where the diffusion source was not deposited were cut by the dicing saw so that the light emitting diode was cut into chips, and then the I–V characteristics of the chips were evaluated.

As a result, it was able to be verified that the leakage current in the light emitting diode did not change after cutting compared to that before cutting, and the leakage current as in a case that the pn junction interface was exposed to the cutting plane did not increase, so that the light emission efficiency may be improved.

The sixth invention according to the present inventions was developed based on the above-described findings, and is an electro luminescence device comprising a compound semiconductor crystal substrate comprising a Group 12 (2B) element and a Group 16 (6B) element in a periodic table, wherein the electro luminescence device is produced by disposing a diffusion source including an element converting the substrate of a first conduction type into the one of a second conduction type on a front surface of the substrate; forming a pn junction in the vicinity of the front surface of the substrate by thermally diffusing the diffusion source; and forming electrodes on both surfaces of the substrate, and wherein the pn junction is formed so that a junction interface will not be exposed to the front surface of the substrate after etching at a cutting plane in the vertical direction.

Accordingly, the pn junction interface is not exposed to the cutting plane, so that the leakage current, which flowed through the pn junction interface in the cutting plane, is extremely reduced and the light emission efficiency can be improved.

With the substrate, the diffusion source may be partially deposited on a portion which is inside at a predetermined distance from the peripheral edge portion of the substrate, and the diffusion source may constitute one of the electrodes.

Preferably, the substrate may be any one of ZnTe, ZnSe and ZnO. Further, the diffusion source may be Al, Ga, In, or alloy thereof.

The electro luminescence device may be produced by disposing a mask on the substrate, the mask covering at least a portion through which a cutting means passes, the cutting means cutting the substrate into chips of an electro luminescence device, and the mask having opening in a portion where the diffusion source is disposed; depositing partially the diffusion source through the mask; forming a pn junction by thermally diffusing the diffusion source; forming electrodes on front and rear of the substrate; and thereafter cutting the substrate into chips by a predetermined cutting means at a portion which was covered with the mask and on which the diffusion source was not deposited. Preferably, the cutting means is a dicing saw, and the portion of the substrate through which the cutting means passes is formed in a width which is not less than double of a width of a blade of the dicing saw.

PREFERRED EMBODIMENT OF THE INVENTION

First Embodiment

The electro luminescence devices will be explained with reference to FIG. 1 and FIG. 2. The p-type ZnTe substrates in which etch pit density on the front surface was 2,000/cm$^2$, 8,000/cm$^2$, or 60,000/cm$^2$, the etch pits being obtained by immersing the substrate in 10 mol % NaOH solution for 4 minutes at 100° C., were used. The electro luminescence device was fabricated by depositing an Al diffusion source on the front surface of the substrate, forming a pn junction by thermally diffusing the diffusion source into the substrate, and providing electrodes.

Figure 1:
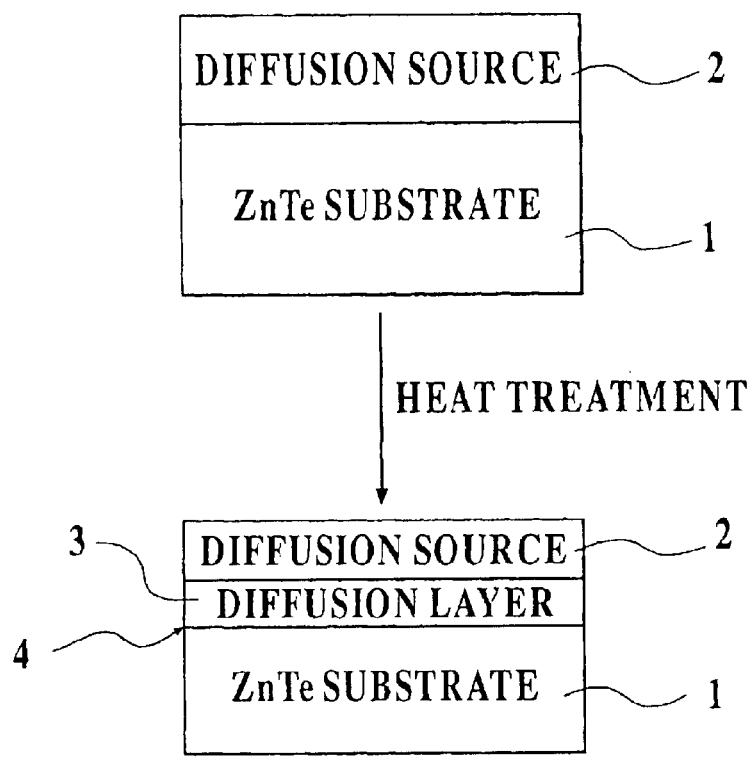
FIG. 1 is a reference view schematically showing fabricating process of light emitting diode as an electro luminescence device according to the present invention; wherein (a) is a schematic view before diffusing the diffusion source; and (b) is a schematic view after diffusing it.
Figure 2:
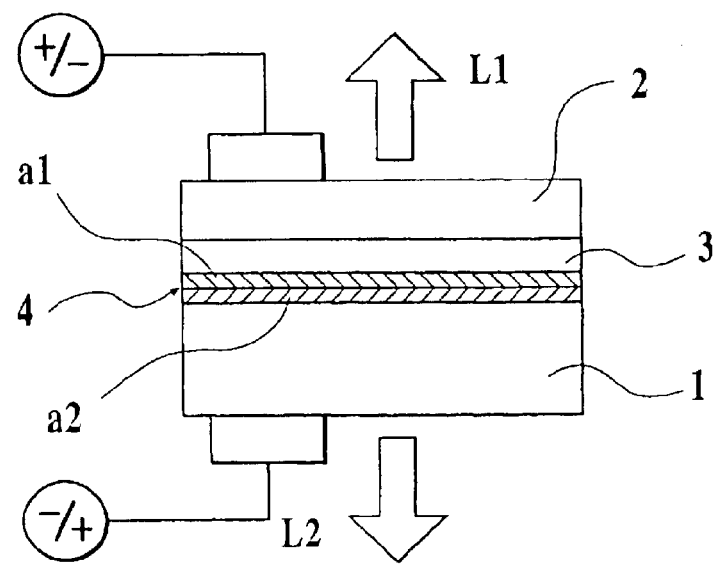
FIG. 2 is a schematic view showing a schematic constitution and light emitting state of the light emitting diode according to the present invention.

FIG. 1 is a reference view schematically showing fabricating process of light emitting diode as the electro luminescence device according to the present invention. FIG. 2 is a schematic view showing a schematic constitution and light emitting state of the light emitting diode according to the present invention.

A p-type ZnTe single crystal substrate in which P (phosphorus) was doped and carrier density was $3 \times 10^{17}$/cm$^3$ was used as a substrate 1. The polished substrate 1 was degreased in acetone, and thereafter cleaned with ultra pure water. Thereafter, the substrate 1 was etched in 2% Br-methanol solution for 5 minutes and cleaned with ultra pure water, and then set in a vacuum evaporator.

The vacuum evaporator was evacuated to a vacuum level of not more than $2 \times 10^{-6}$ Torr, and Al of diffusion source 2 was deposited over the front surface of the substrate in a thickness of 4,000 Å.

Thereafter, the substrate 1 was taken out of the vacuum evaporator, and then disposed in a temperature flat zone of a diffusion furnace, which had a reaction tube made of quartz and was capable of being evacuated.

Then, the inside of the diffusion furnace was evacuated, thereafter nitrogen gas was applied for substitution. After these operations were repeated several times, a heat treatment was carried out for 30 minutes at 550° C., while applying the nitrogen gas.

By this heat treatment, the Al as the diffusion source 2 was diffused into inside of the substrate in a depth of 2 μm from the front surface of the substrate, and thereby an Al diffusion layer 3 was formed, so that a pn junction was formed. In the figure, numeral 4 denotes a pn junction interface formed at a position where a depth from the front surface of the substrate is 2 μm.

After cooling, the substrate 1 was taken out of the furnace. A protective film was formed on a portion of the front surface to leave a part of the Al remained on the front surface, and the substrate 1 was etched. The remained Al will be employed for a surface electrode. Thereafter, the front surface was protected by resist, and thereafter gold was plated on a rear surface as an electrode. Thus, the light emitting diode as the electro luminescence device was fabricated.

Applying the predetermined current to these light emitting diodes fabricated by employing the substrates having different etch pit densities, the light emission characteristics were compared to one another.

With the light emitting diodes fabricated by using the substrates in which etch pit density on the front surface was 2,000/cm$^2$ or 8,000/cm$^2$, light emission L1 in a wavelength range (550 to 630 nm) of green to orange was observed in a light emitting region a1 in a side of the Al diffusion layer 3 against the pn junction interface 4.

Further, light emission L2 in a wavelength range (580 to 630 nm) of yellow to orange was observed in a light emitting region a2 in a side of the substrate 1 against the pn junction interface 4.

On the other hand, with the light emitting diode fabricated by using the substrates in which etch pit density on the front surface was 60,000/cm$^2$, no light emission was observed in either light emitting regions.

Second Embodiment

The electro luminescence devices will be explained with reference to FIG. 1 and FIG. 2. The p-type ZnTe substrates in which inclusion density on the front surface was several/cm$^2$, 4,000/cm$^2$, 50,000/cm$^2$, or 200,000/cm$^2$ were employed. Each electro luminescence device was fabricated by depositing an Al diffusion source on the front surface of the substrate, forming a pn junction by thermally diffusing the diffusion source into the substrate, and providing electrodes.

With respective specimens, cleaning of the substrates, deposition of the diffusion sources, heat treatment (thermal diffusion), and forming of the electrodes were carried out as in the above-described first embodiment, thereby the light emitting diodes as the electro luminescence devices were fabricated.

Applying current to these light emitting diodes, and comparing the light emission characteristics to one another, the light emission from green to yellow was verified from all light emitting diodes.

With the light emitting region a1 in the side of the Al diffusion layer 3 against the pn junction interface 4, the current/voltage characteristics of each light emitting diode were compared with one another. As a result, in the light emitting diodes fabricated by using substrates in which inclusion density on the front surface was several/cm$^2$, 4,000/cm$^2$, or 50,000/cm$^2$, the current rapidly rose at a voltage within a range of from 1V to 1.2V. When the voltage was less than that, little current flowed. It began to emit light within a voltage range of from 2V to 2.4V, and the light emission efficiency was high about 1%.

The light emission L1 emitted from the light emitting region a1 in the side of the Al diffusion layer 3 against the pn junction interface 4 had the wavelength range (550 to 630 nm) of from green to orange. The light emission L2 in the wavelength range (580 to 630 nm) of from yellow to orange was observed in the light emitting region a2 in the side of the substrate 1 against the pn junction interface 4.

On the other hand, with the light emitting diode fabricated by using the substrate in which inclusion density on the front surface was 200,000/cm$^2$, the current began to rise at a voltage of about 0.6V. It began to emit light when the voltage of 4V was applied thereto, however, the light emission efficiency was 0.01%, which was extremely low.

Third Embodiment

The electro luminescence devices will be explained with reference to FIG. 1 and FIG. 2. The p-type ZnTe substrates in which inclusion density on the front surface was several/cm$^2$, 4,000/cm$^2$, 50,000/cm$^2$, or 200,000/cm$^2$ were used for the electro luminescence devices. The electro luminescence device was fabricated by depositing In diffusion source on the front surface of the substrate, forming a pn junction by thermally diffusing the diffusion source into the substrate, and providing electrodes.

With respective specimens, cleaning of the substrates, deposition of the diffusion sources, heat treatment (thermal diffusion), and forming of the electrodes were carried out as in the above-described first embodiment, thereby the light emitting diodes as the electro luminescence devices were fabricated.

Applying current to these light emitting diodes, and comparing the light emission characteristics to one another, the light emission from green to red was verified from all light emitting diodes.

With the light emitting region a1 in a side of a In diffusion layer 3 against the pn junction interface 4, the current/voltage characteristics of each light emitting diode were compared with one another. As a result, in the light emitting diodes fabricated by using substrates in which inclusion density on the front surface was several/cm$^2$, 4,000/cm$^2$, or 50,000/cm$^2$, the current rapidly rose at a voltage within a range of from 2.1V to 2.5V. When the voltage was less than that, little current flowed.

It began to emit light at a voltage within a range of from 2.5V to 3.0V, and the light emission efficiency was about 1%, which was high.

The light emission L1 emitted from the light emitting region a1 in the side of the In diffusion layer 3 against the pn junction interface 4 had the wavelength range (550 to 700 nm) of from green to red. Further, the light emission L2 in the wavelength range (610 to 700 nm) of from orange to red was observed in the light emitting region a2 in the side of the substrate 1 against the pn junction interface 4.

On the other hand, with the light emitting diode fabricated by using the substrate in which inclusion density on the front surface was 200,000/cm$^2$, the current began to rise at a voltage of about 0.5V. It began to emit light when the voltage of 5V was applied thereto, however, the light emission efficiency was 0.01%, which was extremely low.

Fourth Embodiment

The electro luminescence devices will be explained with reference to FIG. 1 and FIG. 2. The p-type ZnTe substrates in which inclusion density on the surface was 4,000/cm$^2$, 50,000/cm$^2$, or 200,000/cm$^2$ were used for the electro luminescence devices. The electro luminescence device was fabricated by depositing a diffusion source comprising Al and In on the front surface of the substrate, forming a pn junction by thermally diffusing the diffusion source into the substrate, and providing electrodes.

With respective specimens, cleaning of the substrates, deposition of the diffusion sources, heat treatment (thermal diffusion), and forming of the electrodes were carried out as in the above-described first embodiment. Thereby the light emitting diodes as the electro luminescence devices were fabricated. As the diffusion sources, several kinds of the diffusion sources, each of which having different alloy compositions of Al and In, were used.

Applying current to these light emitting diodes, and comparing the light emission characteristics one another, the light emission L1 emitted from the light emitting region a1 in the side of the diffusion layer 3 against the pn junction interface 4 had the wavelength range (500 to 700 nm) of from green to red. Further, the light emission L2 emitted from the light emitting region a2 in the side of the substrates 1 against the pn junction interface 4 had the wavelength range (580 to 700 nm) of from yellow to red.

With the wavelength of light emission from the light emitting region a2 in the side of the substrate 1, it was observed that an intensity ratio between yellow and red was varied with the composition of Al and In.

That is, the larger the Al composition was, the stronger the yellow light emission intensity, became, while the larger the In composition was, the larger the intensity ratio of red became. It was found accordingly that the wavelength, which was measured by a color luminance meter, varied from yellow to red.

As described above, according to the light emitting diodes as the electro luminescence devices of the first to fourth embodiments, since the dislocation density, etch pit density or inclusion density in the pn junction interface is low, the leakage current caused by the recombination is small, and thus efficient light emission can be produced.

As for the p-type ZnTe substrate, it is not limited to the case that P is doped into the substrate as in the above-described embodiment. The Group 15 (5B) elements, such as As, Sb or the like, or the Group 11 (1B) elements, such as Cu, Ag, Au or the like may be doped into the substrate.

Further, n-type ZnTe substrate may be used in place of the p-type ZnTe substrate. In this case, the Group 13 (3B) elements of Al, Ga, In or the like, or the Group 17 (7B) elements of Cl, Br, I or the like may be doped. Not only ZnTe, but also ZnSe or ZnO may be employed for the substrate material.

Furthermore, the diffusion source is not required to be deposited on the front surface of the substrate as in the above-described examples. For example, element converting the conduction type of the substrate into another one or diffusion source including the element may be disposed at a position apart from the substrate, and the element or the diffusion source may be thermally diffused from the front surface of the substrate by heating the element or the diffusion source. Alternatively, supplying gas including element to be diffused to the front surface of the substrate, the element may be thermally diffused from the front surface of the substrate.

Fifth Embodiment

The method for fabricating an electro luminescence device will be explained with reference to FIG. 1 and FIG. 2. The method comprises the steps of providing a p-type ZnTe substrate, depositing a diffusion source on the front surface of the substrate, forming a pn junction by thermally diffusing the diffusion source into the substrate, and providing electrodes.

A p-type ZnTe single crystal substrate in which, for example, P is doped and carrier density is $3 \times 10^{17}$/cm$^3$ is used as a substrate 1. The polished substrate 1 is degreased in acetone, and thereafter cleaned with ultra pure water. Thereafter, the substrate 1 is etched in 2% Br-methanol solution for 5 minutes and cleaned with ultra pure water, and then set in the vacuum evaporator.

The vacuum evaporator is evacuated to a vacuum level of not more than $2 \times 10^{-6}$Torr, and diffusion source 2, for example, Al and Si are deposited over the front surface of the substrate in a thickness of 1,000 to 10,000 Å. preferably in a thickness of 1,500 to 5,000 Å.

The diffusion source 2 has an effect on prevention that a defect (vacancy, or defect including the vacancy) compensating a level showing the conduction type (n-type), which is different from the conduction type (p-type) of the substrate 1, is formed during diffusion step. The diffusion source 2 also has an effect on gettering impurity (for example, at least one of O, Li, Ag, Cu, and Au) in the front surface of the substrate.

In this case, the diffusion source 2 comprises Al and Si, however, it is not limited to this. It may comprise Ga, In or alloy including them, or Cl, Br, I or alloy including them in place of Al. Furthermore, B (boron) or C (carbon) may be employed in place of Si.

The diffusion source 2 may be constituted so that the Gibbs' free energy (G=F+pV: thermodynamic characteristic function) of a compound comprising the element constituting the diffusion source 2 and the impurity in the substrate 1 may be smaller than the Gibbs' free energy of a compound of the constitute element of the substrate 1 and the impurity in the substrate 1 at the diffusion temperature.

It is an essential condition that the element (for example, Si) included in the diffusion source 2 and gettering the impurity in the substrate 1 has a slow diffusion rate in the substrate compared with the element (for example, Al) converting the substrate 1 of the first conduction type into the one of the second conduction type. That is, if this condition is not satisfied, the pn junction is not formed ultimately, which is verified with experiments by inventors or the like.

To the method for depositing the diffusion source 2, a sputtering method, a resistance heating method, an electron beam method, or the like may be applied.

Next, the substrate 1 is taken out of the vacuum evaporator, and then disposed in a temperature flat zone of a diffusion furnace, which has a reaction tube made of, for example, quartz and is capable of being evacuated.

Then, the inside of the diffusion furnace is evacuated, thereafter nitrogen gas is applied for substitution. After these operations are repeated several times, a heat treatment is carried out on predetermined conditions, while applying the nitrogen gas.

Figure 3:
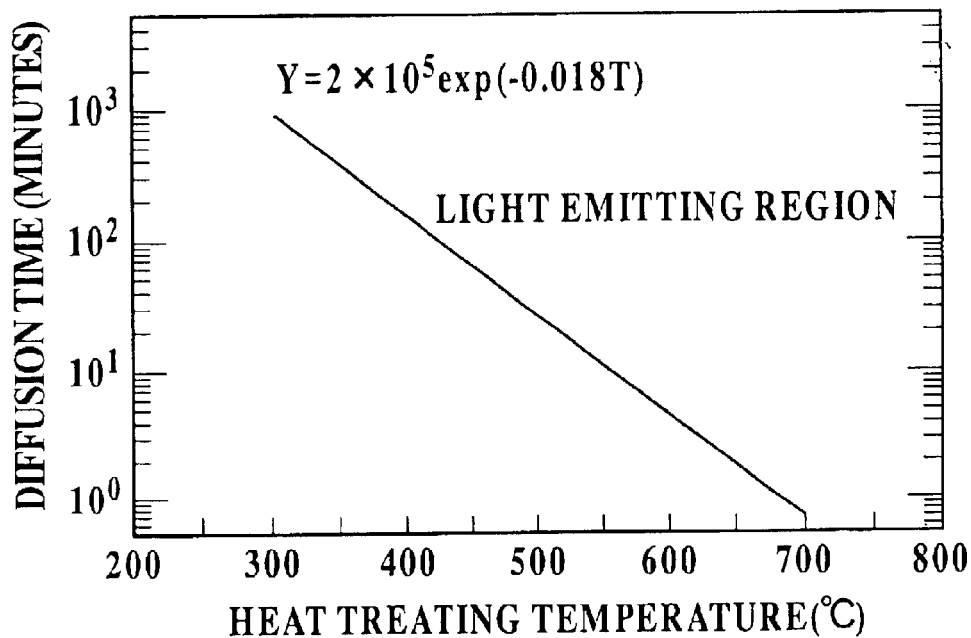
FIG. 3 is a graph showing a relation between heat treating temperature and diffusion time in the producing method of the electro luminescence device according to the present invention.
Figure 4:
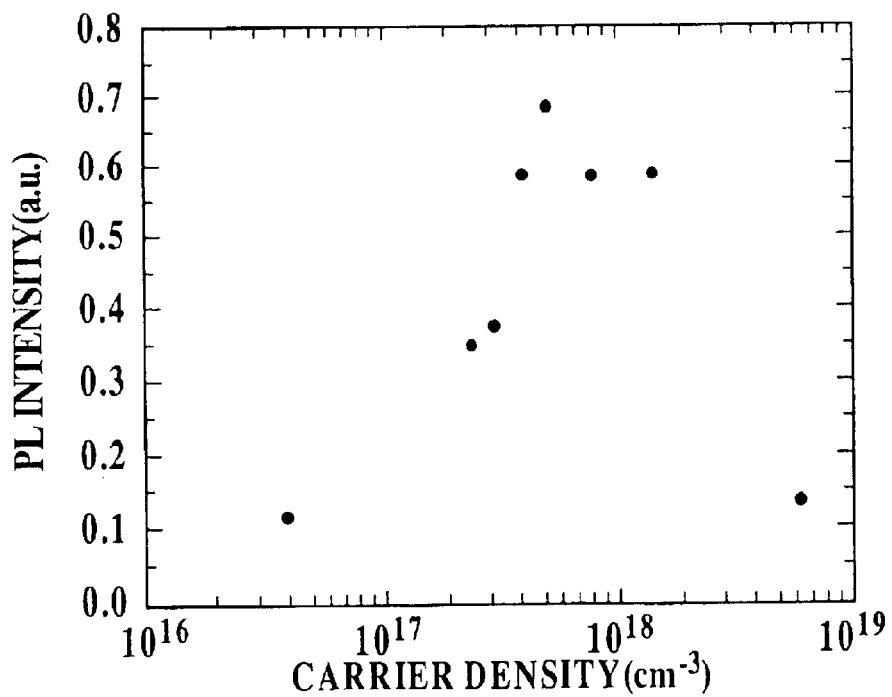
FIG. 4 is a graph showing a relation between PL intensity and carrier density of the substrate.
Figure 5:
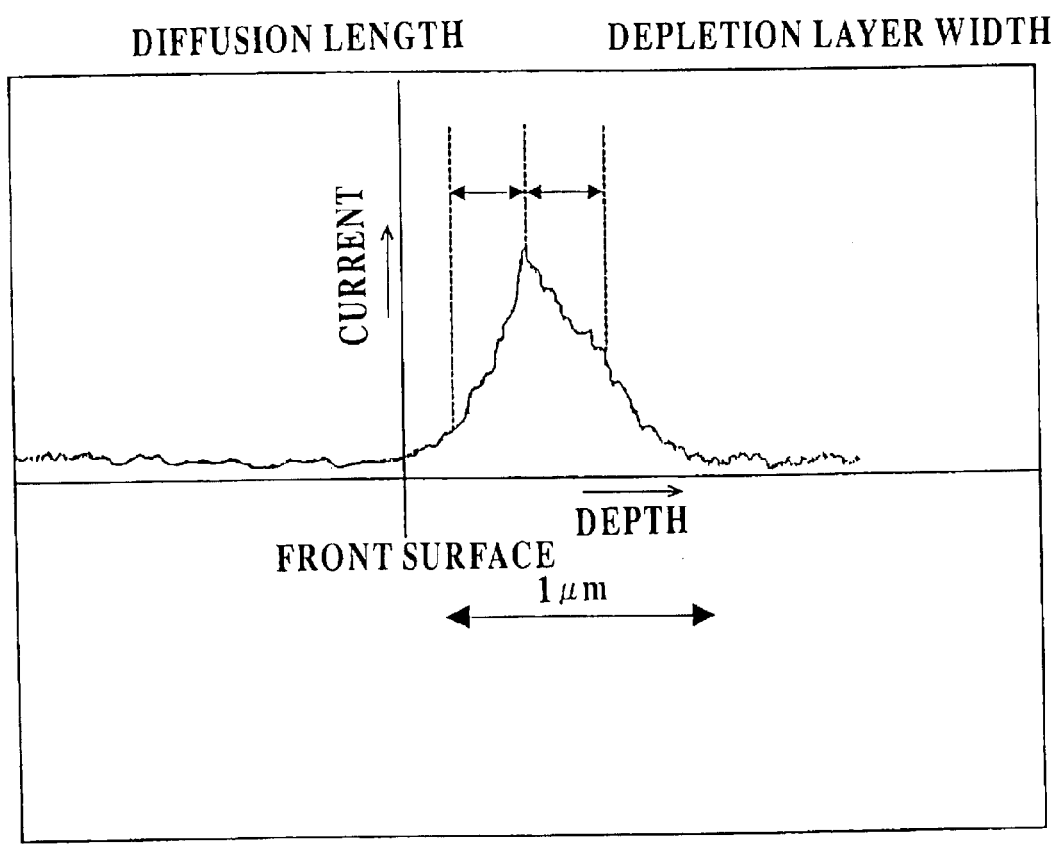
FIG. 5 is a graph showing a result of measuring a cross section of the substrate by the EBIC method after diffusing the diffusion source.

These heat treatment conditions are determined by the range in which the finally formed light emitting element emits light, the range being a result of the experiments by the inventors or the like. That is, as shown in the graph in FIG. 3, showing the relation between the heat treating temperature and the diffusion time, excellent result can be obtained when the diffusion time is set so that it will be longer than the time specified by a relational expression $Y=2\times10^5\exp(-0.018\,T)$, showing the relation between the diffusion time Y and the heat treating temperature T, within a range of the heat treating temperature of 300 to 700° C.

As a result of this heat treatment, layers of Al and Si as the diffusion source 2 thermally diffuse alternately to form Al diffusion layer and Si diffusion layer in turn. These Al and Si diffusion layers constitute the diffusion layer 3, thus the pn junction interface 4 is formed between the substrate 1 and the diffusion layer 3.

It is verified with the experiments by the inventors or the like that remaining of the diffusion source 2 in a predetermined thickness after the heat treatment is an essential condition for forming the light emitting element.

In the above-described embodiment, remaining of the diffusion source 2 in a thickness of not less than 100 Å, preferably, not less than 300 Å, is the essential condition. Accordingly, the heat treating temperature and the diffusion time during the diffusion are set so that these will satisfy the relation between the heat treating temperature and the diffusion time, as shown in FIG. 3, and the diffusion source 2 will remain in the determined thickness after diffusion.

Then, the substrate 1 heat treated as described above is cooled, and thereafter taken out. The Si diffusion layer on the front surface of the substrate 1 is removed therefrom by etching or the like.

Thereafter, the front surface is protected with resist, and then gold is plated on a rear surface as an electrode. Thus, the light emitting diode as the electro luminescence device is fabricated.

Sixth Embodiment

The electro luminescence devices fabricated by using ZnTe substrates according to the method for producing an electro luminescence device explained in the fifth embodiment will be explained. The electro luminescence devices were fabricated by depositing Al diffusion sources on the front surfaces of the substrates, forming pn junctions by heat treating the diffusion sources on different conditions for diffusing the diffusion sources into the substrates, and providing electrodes.

A p-type ZnTe single crystal substrate in which carrier density is $5\times10^{17}/cm^3$ was employed for a substrate 1. The polished substrate 1 was degreased in acetone, and thereafter cleaned with ultra pure water. Thereafter, the substrate 1 was etched in 2% Br-methanol solution for 5 minutes and cleaned with ultra pure water, and then set in a vacuum evaporator. The vacuum evaporator was evacuated to a vacuum level of not more than $2\times10^{-6}$ Torr, and Al as a diffusion source 5 was deposited over the front surface in a thickness of 4,000 Å.

Next, the substrate 1 was taken out of the vacuum evaporator, and then disposed in a temperature flat zone of a diffusion furnace (Rapid Thermal anneal furnace). Then, the inside of the diffusion furnace was evacuated, thereafter nitrogen gas was applied for substitution. After these operations were repeated several times, a heat treatment was carried out on such conditions as shown in Table 2, while applying the nitrogen gas.

After cooling, the substrate 1 was taken out. An Al deposited surface and a side surface were coated with resist. Gold as an electrode was plated on a surface opposite the Al deposited surface by an electroless plating method. A heat treatment was performed for 5 minutes at 200° C. for taking ohmic between the ZnTe substrate and the gold, thus the light emitting diode as the electro luminescence device was fabricated.

The electro luminescence of the light emitting diodes fabricated in this way was observed with a potentiostat, and the result is shown in Table 2.

TABLE 2

Relation between heat treatment conditions and electro luminescence

| Heating temperature (° C.) | Time (minute) | Luminescence | Time (minute) | Luminescence | Time (minute) | Luminescence |
|---|---|---|---|---|---|---|
| 600 | 2 | X | 4 | ○ | 10 | ○ |
| 650 | 1 | X | 1.5 | ○ | 5 | ○ |
| 700 | 0.167 (10 seconds) | X | 0.5 | ○ | 1 | ○ |

○: emit light
X: not emit light

When the heating temperature was 600° C., the light emitting diode did not emit light in a case of 2 minutes heat treatment, while it emitted light in cases of 4 minutes and 10 minutes heat treatments.

When the heating temperature was 650° C., the light emitting diode did not emit light in a case of 1 minute heat treatment, while it emitted light in cases of 1.5 minutes and 5 minutes heat treatments.

When the heating temperature was 700° C., the light emitting diode did not emit light in a case of 0.167 minute (about 10 seconds) heat treatment, while it emitted light in cases of 0.5 or 1 minute heat treatments.

The colors of the emitted light were green and yellow, and the light emitting diode emitted light ununiformly inplane.

As a result of measuring the I–V characteristics, it was found that the light emitting diode showed the rectifying characteristics.

Furthermore, when the thickness of the n-type Al diffusion layer was measured by the EBIC method, it was 1 to 2 µm.

Seventh Embodiment

The electro luminescence devices fabricated by depositing the Al diffusion sources in a thickness of 2,000 Å in the sixth embodiment, and thermally diffusing them on the conditions as shown in Table 3 will be explained. The processes of the cleaning of the substrate, the forming of the electrodes or the like were carried out as in the sixth embodiment.

The electro luminescence of the light emitting diodes fabricated in this way was observed with a potentiostat, and the result is shown in Table 3.

TABLE 3

Relation between heat treatment conditions and electro luminescence

| Heating temperature (° C.) | Time (minute) | Luminescence | Time (minute) | Luminescence | Time (minute) | Luminescence |
|---|---|---|---|---|---|---|
| 300 | 480 | X | 960 | ○ | 1440 | ○ |
| 400 | 60 | ○ | 150 | ○ | 480 | ○ |
| 500 | 15 | X | 30 | ○ | 60 | ○ |

○: emit light
X: not emit light

When the heating temperature was 300° C., the light emitting diode did not emit light in a case of 480 minutes heat treatment, while it emitted light in cases of 60 minutes and 1440 minutes heat treatments.

When the heating temperature was 400° C., the light emitting diode emitted light in all cases of 60 minutes, 150 minutes and 480 minutes heat treatments.

When the heating temperature was 500° C., the light emitting diode did not emit light in a case of 15 minutes heat treatment, while it emitted light in cases of 30 minutes and 60 minutes heat treatments.

In the case of that the light emitting diode emitted light, when gradually increasing the voltage in forward direction, it emitted light from about 3.5V, and the colors thereof were green and yellow.

The light emitting diode, which was heat treated for 480 minutes at 400° C., emitted light more uniform than the one, which was heat treated for 60 minutes at 400° C.

As a result of measuring I–V characteristics, the light emitting diode showed the rectifying characteristics.

Eighth Embodiment

The electro luminescence devices fabricated by depositing In as the diffusion source in a thickness of 2,500 Å in the sixth embodiment, and thermally diffusing it on the conditions as shown in Table 4 will be explained. The processes of the cleaning of the substrate, the forming of the electrode or the like were carried out as in the sixth embodiment.

The electro luminescence of the light emitting diodes fabricated in this way was observed with a potentiostat, and the result is shown in Table 4.

TABLE 4

Relation between heat treatment conditions and electro luminescence

| Heating temperature (° C.) | Time (minute) | Luminescence | Time (minute) | Luminescence | Time (minute) | Luminescence |
|---|---|---|---|---|---|---|
| 300 | 480 | X | 960 | ○ | 1440 | ○ |
| 400 | 60 | X | 150 | ○ | 480 | ○ |
| 500 | 15 | X | 30 | ○ | 60 | ○ |

○: emit light
X: not emit light

When the temperature condition was 300° C., the light emitting diode did not emit light in a case of 480 minutes heat treatment, while it emitted light in cases of 960 minutes and 1440 minutes heat treatments.

When the temperature condition was 400° C., the light emitting diode did not emit light in a case of 60 minutes heat treatment, while it emitted light in cases of 150 minutes and 480 minutes heat treatments.

When the temperature condition was 500° C., the light emitting diode did not emit light in a case of 15 minutes heat treatment, while it emitted light in cases of 30 minutes and 60 minutes heat treatments.

The color of emitted light was yellow.

As a result of measuring I–V characteristics, the light emitting diode showed the rectifying characteristics.

Ninth Embodiment

The electro luminescence devices fabricated by depositing In as the diffusion source in a thickness of 2,000 Å in the sixth embodiment, and thermally diffusing it on the conditions as shown in Table 5 will be explained. The processes of the cleaning of the substrate, the forming of the electrode or the like were carried out as in the sixth embodiment.

The electro luminescence of the light emitting diodes fabricated in this way was observed with a potentiostat, and the result is shown in Table 5.

TABLE 5

Relation between heat treatment conditions and electro luminescence

| Heating temperature (° C.) | Time (minute) | Luminescence | Time (minute) | Luminescence | Time (minute) | Luminescence |
|---|---|---|---|---|---|---|
| 550 | 5 | X | 10 | ○ | 60 | ○ |
| 650 | 1 | X | 1.5 | ○ | 5 | ○ |
| 700 | 0.167 | X | 0.5 | ○ | 1 | ○ |

○: emit light
X: not emit light

When the heating temperature was 550° C., the light emitting diode did not emit light in a case of 5 minutes heat treatment, while it emitted light in cases of 10 minutes and 60 minutes heat treatments.

When the heating temperature was 650° C., the light emitting diode did not emit light in a case of 1 minute heat treatment, while it emitted light in cases of 1.5 minutes and 5 minutes heat treatments.

When the heating temperature was 700° C., the light emitting diode did not emit light in a case of 0.167 minute (about 10 seconds) heat treatment, while it emitted light in cases of 0.5 minute and 1 minute heat treatments.

The colors of emitted light were green and red.

As a result of measuring I–V characteristics, the light emitting diode showed the rectifying characteristics.

According to the above-described fifth to ninth embodiments, the diffusion source disposed on the front surface of the substrate prevents that the defect is formed during the diffusion process, the defect compensating the level showing the conduction type which is different from the conduction type of the substrate. Furthermore, the diffusion source getters the impurity on the front surface of the substrate, thus the effect of selfcompensation is prevented and the purity of the crystal surface can be improved. Therefore, the light emitting element can be stably produced by controlling the conduction type of the Group II–VI compound semiconductor, which was difficult conventionally.

Tenth Embodiment

The electro luminescence devices fabricated by using substrates which were sliced from ZnTe semiconductor single crystal at (111)Zn plane, (111)Te plane, (001) plane or (011) plane will be explained. The electro luminescence device was fabricated by depositing Al diffusion source on the front surface of the substrate, forming a pn junction by thermally diffusing the diffusion source into the substrate, and providing electrodes. The (111)Zn plane and (111)Te plane, both of which fall into (111) plane category, were judged by the surface pits occurred on the front surface of specimens by hydrochloric acid treatment.

At first, a ZnTe semiconductor single crystal was grown from melt so that the dislocation density would be not more than 5,000/cm$^2$. The crystal was sliced along the (111)Zn plane, (111)Te plane, (001) plane or (011) plane to obtain the substrates.

Next, after lapping (lapping) the front surface of each specimen, the surface was removed in several micrometers with hydrobromic acid system etchant (for example, hydrobromic acid: 100 ml/1+bromine: 5 ml/1 ). The etchant may be bromine system of 3% bromine-methanol or the like.

Thereafter, each specimen was loaded in a vacuum evaporator, and the vacuum evaporator was evacuated to a vacuum level of not more than $2 \times 10^{-6}$Torr. Al as the diffusion source was deposited over the front surface of each specimen in a thickness of 1,000 to 10,000 Å, preferably 1,500 to 5,000 Å by the EB (electron beam method) heating.

The diffusion source is not limited to Al, Ga, In, or alloy thereof, or Cl, Br, I, or alloy thereof may be employed in place of Al.

Respective specimens having front surfaces on which Al was deposited were loaded in a diffusion furnace, and thermal diffusion was carried out on a condition of 16 hours at 420° C. under nitrogen atmosphere. After the thermal diffusion process, the rear surface of the specimen was plated with gold as an electrode by electroless plating solution. After plating, the alloying heat treatment was carried out, so that light emitting diodes as the electro luminescence devices were fabricated.

With respective light emitting diodes fabricated by using the four type specimens (substrates) as above-described, the Al remained on the front surface and the gold plating formed on the rear surface were used as electrodes and the light emission characteristics or the like were evaluated by turning on electricity.

As a result, with the light emitting diode fabricated by using the substrate having substrate plane of (111)Te plane, leakage current was large, and it was possible to observe only very small spot-like green light emission. Thus, the light emission characteristic was inferior.

On the other hand, with other light emitting diodes fabricated by using the substrates having substrate plane of (111)Zn plane, (001) plane or (011) plane, it was possible to observe green light emission from entire front surface, and thus it was possible to verified that the light emission characteristics were superior.

Eleventh Embodiment

The electro luminescence devices fabricated by using substrates which were sliced from ZnTe semiconductor single crystal in 10 degrees off-angles from (111)Zn plane, (111)Te plane, (001) plane or (011) plane will be explained. The electro luminescence device was fabricated by depositing Al diffusion source on the front surface of the substrate, forming a pn junction by thermally diffusing the diffusion source into the substrate, and providing electrodes. The (111)Zn plane and (111)Te plane, both of which fall into (111) plane category, were judged by the surface pits occurred on the front surface of specimens by hydrochloric acid treatment, as in the tenth embodiment.

At first, a ZnTe semiconductor single crystal was grown from melt so that the dislocation density would be not more than 5,000/cm$^2$. The crystal was sliced in 10 degrees off-angles from the (111)Zn plane, (111)Te plane, (001) plane or (011) plane to obtain the substrates.

Then, with respective specimens, light emitting diodes as the electro luminescence devices were fabricated with the same process as in the tenth embodiment as above-described.

With respective light emitting diodes fabricated by using the four type specimens (substrates) as above-described, the Al remained on the front surface and the gold plating formed on the rear surface were used as electrodes and the light emission characteristics or the like were evaluated by turning on electricity.

As a result, with the light emitting diode fabricated by using the substrate having substrate plane inclining 10 degrees from the (111)Te plane, there were portions emitting no light. Although there were portions emitting light, it was weak green light. Thus, the luminescence characteristic was inferior.

On the other hand, with other light emitting diodes fabricated by using the substrates each having substrate plane inclining 10 degrees from the (111)Zn plane, (001) plane or (011) plane, it was possible to observe green light emission from entire front surface. Thus it was possible to verified that the light emission characteristics were superior. The inclining angle is not limited to 10 degrees. The angle within 10 degrees may be possible.

According to the producing method of electro luminescence device concerning with the tenth and eleventh embodiments, by limiting the substrate plane orientation, the light emitting diodes having superior light emission characteristics can be stably produced.

Twelfth Embodiment

The electro luminescence devices fabricated by using ZnTe substrates, depositing Al diffusion sources in different thicknesses on the front surfaces of the substrates, forming pn junctions by thermally diffusing the diffusion sources into the substrates, and providing electrodes will be explained.

At first, a ZnTe semiconductor single crystal was grown from melt so that the dislocation density would be not more than 5,000/cm$^2$ to obtain the substrates of the electro luminescence devices according to this embodiment.

Next, after removing the front surfaces of the ZnTe substrates in several μm with bromine system etchant, the substrates were disposed in a vacuum evaporator. Then, the Al diffusion sources 1 were deposited over front surfaces in film thicknesses of 5 nm, 10 nm, 20 nm, 50 nm, 100 nm, 200 nm and 500 nm, respectively, by the EB (electron beam method) heating.

Next, the substrates having the front surfaces on which Al diffusion source was deposited were disposed in the diffusion furnace, and diffusion process was carried out for 16 hours at 420° C. under nitrogen atmosphere, so that pn junctions were formed. After the diffusion process, the diffusion sources were remained on all specimens.

After the diffusion process, a substrate plane opposite to the plane on which the Al diffusion source was formed was plated with gold as an electrode by electroless plating solution. After plating, the alloying heat treatment was carried out, so that light emitting diodes according to this embodiment were fabricated.

The light emission obtained through the Al diffusion source with the respective fabricated light emitting diodes was observed, and the result thereof is shown in Table 6.

TABLE 6

| Al film thickness (nm) | Green light emission | Yellow light emission |
| --- | --- | --- |
| 5 | ◎ | △ |
| 10 | ◎ | △ |
| 20 | ◎ | △ |
| 50 | ○ | ○ |
| 100 | △ | ○ |
| 200 | △ | ○ |
| 500 | △ | ○ |

From the light emitting diodes fabricated by depositing the Al diffusion source in the film thicknesses of 5, 10, 20, and 50 nm, the green light emission was observed. Particularly, with the light emitting diodes fabricated by depositing the Al diffusion source in the film thicknesses of 5, 10, and 20 nm, stable green light having high light emission intensity was visible.

On the other hand, with the light emitting diodes fabricated by depositing the Al diffusion source in the film thicknesses of 100, 200, and 500 nm, the yellow light became stronger than the green light in the relative intensity. Furthermore, current value decreased and the total light emission intensity lowered compared with the light emitting diodes fabricated by depositing the Al diffusion source in the film thicknesses of 5, 10, 20, and 50 nm.

The invention achieved by the inventors is explained concretely based on the examples, however, the invention is not limited to the examples. For example, when ZnSe, ZnO or the like is employed for the Group II–VI compound semiconductor crystal substrate, the same effect may be expected. Furthermore, as the diffusion source, for example, Ga, In, or alloy thereof may be expected to have the same effect.

Thirteenth Embodiment

The electro luminescence devices fabricated by using ZnTe substrates having different carrier density, depositing Al diffusion sources on the front surfaces of the substrates, forming pn junctions by thermally diffusing the diffusion sources into the substrates, and providing electrodes will be explained.

At first, a ZnTe semiconductor single crystal was grown from melt so that the dislocation density would be not more than 5,000/cm$^2$. This was employed as the substrates of the electro luminescence devices according to this embodiment. Predetermined amount of $Zn_3P_2$ (zinc phosphide) was added as dopant, and thus carrier densities of the ZnTe crystals were $7\times10^{16}$, $1\times10^{17}$, $3\times10^{17}$, $5\times10^{17}$, $9\times10^{17}$, $2\times10^{18}$, $5\times10^{18}$, and $7\times10^{18}$ cm$^{-3}$.

The desired carrier density is achieved by adjusting of the amount of $Zn_3P_2$ added to ZnTe. For example, adding $Zn_3P_2$ of 10 mg to ZnTe of 540 g achieves the carrier density of $5\times10^{17}$ cm$^{-3}$. The values of the carrier densities were measured by four terminals method after crystal growth.

Next, after lapping (lapping) the front surface of each substrates, the front surface was removed in several micrometers with hydrobromic acid system etchant (for example, hydrobromic acid: 100 ml/l+bromine: 5 ml/l). The etchant may be bromine system of 3% bromine-methanol or the like.

Thereafter, each specimen was loaded in a vacuum evaporator, and the vacuum evaporator was evacuated to a vacuum level of not more than $2\times10^{-6}$Torr. Al as the diffusion source was deposited over each front surface of the substrate in a thickness of 150 nm by the EB (electron beam method) heating.

Respective specimens having front surfaces on which Al diffusion source was deposited were loaded in a diffusion furnace, and thermal diffusion was carried out on a condition of 16 hours at 420° C. under nitrogen atmosphere. After the thermal diffusion process, the rear surface of the substrate was plated with gold as an electrode by electroless plating solution. After plating, the alloying heat treatment was carried out, so that light emitting diodes of this embodiment were fabricated.

With respective light emitting diodes fabricated as above-described, the Al diffusion source remained on the front surface, and the gold plating formed on the rear surface were used as electrodes, and the light emission characteristics were evaluated by turning on electricity.

As a result, with the light emitting diodes fabricated by using the substrates in which the carrier density was $7\times10^{16}$ or $7\times10^{18}$ cm$^{-3}$, the green light emission was not observed under the room lighting. On the other hand, with the light emitting diodes fabricated by using the substrates in which the carrier density was $1\times10^{17}$, $3\times10^{17}$, $5\times10^{17}$, $7\times10^{17}$, $9\times10^{17}$, $2\times10^{18}$, or $5\times10^{18}$ cm$^{-3}$, it was possible to observe the green light emission under the room lighting. Particularly, with the light emitting diodes fabricated by using the substrates having the carrier density of $3\times10^{17}$, $5\times10^{17}$, $7\times10^{17}$, $9\times10^{17}$ or $2\times10^{18}$, these emitted stable green light with high intensity.

According to the above-described embodiment, it was possible to fabricate the electro luminescence device having superior light emission characteristics by employing the substrate having carrier density of $1\times10^{17}$ to $5\times10^{18}$ cm$^{-3}$.

The invention achieved by the inventors is explained concretely based on the examples, however, the invention is not limited to the examples. When the Group II–VI compound crystal substrate, such as ZnSe, ZnO or the like is employed for the substrate, the same effect may be expected. Furthermore, as the diffusion source, for example, Ga, In, or alloy thereof may be expected to have the same effect.

Fourteenth Embodiment

The electro luminescence devices fabricated by using ZnTe substrates, depositing Al diffusion sources on the front surfaces of the substrates, forming pn junctions by thermally diffusing the diffusion sources into the substrates in different depths, and providing electrodes will be explained.

At first, a ZnTe semiconductor single crystal was grown from melt so that the dislocation density would be not more than 5,000/cm$^2$. This was employed as the substrates of the electro luminescence devices according to this embodiment.

Next, after lapping, the front surface was removed in several micrometers with hydrobromic acid system etchant (for example, hydrobromic acid: 100 ml/l+bromine: 5 ml/l) or the like.

Thereafter, each substrate was loaded in a vacuum evaporator, and the vacuum evaporator was evacuated to a vacuum level of not more than 2×10$^{-6}$Torr. Al as the diffusion source was deposited over each front surface of the substrate in a thickness of 1,000 to 10,000 Å, preferably, 1,500 to 5,000 Å by the EB (electron beam method) heating.

The substrates having front surfaces on which Al was deposited were loaded in turn in a diffusion furnace. Then, the thermal diffusion was carried out on 6 conditions of 0.5 hour, 2 hours, 8 hours, 16 hours, 32 hours and 72 hours at 420° C. under nitrogen atmosphere. Thereby, it is possible to form the pn junctions of 6 diffusion depths.

After the thermal diffusion process, the rear surface of each substrate was plated with gold as an electrode by electroless plating solution. After plating, the alloying heat treatment was carried out, so that light emitting diodes as the electro luminescence devices were fabricated.

With respective light emitting diodes, in total 6 types, fabricated as above-described, the Al remained on the front surface and the gold plating formed on the rear surface were used as electrodes, and the light emission characteristics or the like were evaluated by turning on electricity. The result thereof as shown in Table 7 was obtained.

TABLE 7

| Diffusion constant: 5.02 × 10$^{-13}$ (420° C.) | | | |
|---|---|---|---|
| Diffusion time (hour) | Diffusion time (second) | Diffusion length (μm) | Luminescence characteristic |
| 0.5 | 1800 | 0.30 | Δ |
| 2 | 7200 | 0.60 | ○ |
| 8 | 28800 | 1.20 | ◎ |
| 16 | 57600 | 1.70 | ○ |
| 32 | 115200 | 2.40 | X |
| 72 | 259200 | 3.61 | X |

A position of the junction interface, that is, the diffusion length was specified by observing a cleavage surface of the substrate of each light emitting diode by SEM (secondary electron microscope) and with light and shade of the SEM image.

As shown in Table 7, in a range of diffusion length of from 0.3 to about 2.0 μm (that is, when diffusion times were 0.5 hour, 2 hours, 8 hours and 16 hours), it was possible to verify the green light emission, and the light emission intensity was almost excellent. A luminescence center wavelength was 550 to 570 nm.

On the other hand, in a range that diffusion length exceeded 2.0 μm (that is, when diffusion times were 32 hours and 72 hours), it was difficult to observe the green light emission.

Thus, the light emitting diode having high light emission intensity can be obtained by limiting the diffusion length to a range of 0.3 to about 2.0 μm.

In this embodiment, the Al diffusion into the ZnTe substrate is explained with an example, however, the substrate and diffusion source do not limited thereto. When the Group II–VI substrate, such as ZnSe, ZnO or the like is employed for the substrate, the same effect may be expected. As the diffusion source, for example, Ga, In, or alloy thereof may be expected to have the same effect.

Fifteenth Embodiment

The electro luminescence devices fabricated by using ZnTe substrates, depositing Al diffusion sources on the front surfaces of the substrates, forming pn junctions by thermally diffusing the diffusion sources into the substrates in different depths, providing electrodes, and cutting into chips so that the pn junction interfaces will not be exposed to the cutting planes will be explained.

At first, a ZnTe semiconductor single crystal was grown from melt so that the dislocation density would be not more than 5,000/cm$^2$. This was employed as the substrates of the electro luminescence devices according to this embodiment.

This substrate was lapped, and the front surface was removed in several micrometers with hydrobromic acid system etchant (for example, hydrobromic acid: 100 ml/l+ bromine: 5 ml/l) or the like. Thereafter, the substrate was cleaned with ultra pure water.

Then, deposition mask in which a plurality of openings of 280 μm square were formed was set on the front surface of the substrate. Interval between the square openings is set as, for example, 40 μm that is about the double of 20 μm that is width of a blade of the dicing saw as cutting means, which is used for cutting the substrate into chips in the following process.

Thereafter, the substrates on which the masks were set were loaded in a vacuum evaporator, and the vacuum evaporator was evacuated to a vacuum level of not more than 2×10$^{-6}$Torr. Al as the diffusion source was deposited on the front surface of the substrate in a thickness of 15 nm by the EB (electron beam method) heating. In this time, the Al was deposited only on the portions corresponding to the opening portions (280 μm square openings) of the mask. On the periphery of the Al deposited portions, the portions where the Al was not deposited were formed in a width of 40 μm.

The substrates having the front surface on which the Al was partially deposited were loaded in a diffusion furnace, and the thermal diffusion was carried out for 16 hours at 420° C. under nitrogen atmosphere.

After the thermal diffusion process, the Al deposited plane of the substrate was protected with resist, and the rear surface of each substrate was plated with gold by electroless plating solution. After plating, the alloying heat treatment was carried out, so that electrodes were formed.

Thereafter, the substrates were cut into a plurality of chips trough the portions of 40 μm width where the Al was not deposited on the front surface of the substrate by using the dicing saw as a cutting means (thickness of the blade was about 20 μm). Thus, the light emitting diodes as the electro luminescence devices were obtained. When the cutting plane of each chip was observed with the SEM, light and shade corresponding to the pn junction was not appeared. Thus, it was possible to verify that the pn junction interface was not exposed to the cutting plane.

With respective chips of the light emitting diodes, the Al remained on the front surface and the gold plating formed on the rear surface were used as electrodes, and the current-voltage characteristics were evaluated by turning on electricity. As a result, it was verified that before and after cutting the substrates into the chips, there was no change in the amount of leakage current, thus it is possible to reduce effectively the leakage current, which flowed through the pn junction interface as in conventional technology.

With chips that were cut from the substrate at approximately the centers of the Al deposited 280 $\mu$m squares, the current-voltage characteristics of the chips were evaluated similarly for comparison. As a result, it was verified that the leakage current increased in single figure or more after cutting into chips compared to before cutting.

In this case, since the pn junction layer was recognized in the cutting plane of the chip, it is presumed that the increase of the leakage current is due to the influence of the pn junction interface exposed to the cutting plane.

From the above-described result, according to the producing method of this embodiment, there is no pn junction interface in the cutting plane when the light emitting diode is cut into chips. Therefore, the leakage current is effectively reduced, and the light emitting diode having improved light emission efficiency can be stably produced.

In this embodiment, the Al diffusion into the ZnTe substrate is explained with an example, however, the substrate and diffusion source do not limited thereto. When the Group II–VI substrate, such as ZnSe, ZnO or the like is employed for the substrate, the same effect may be expected. As the diffusion source, for example, Ga, In, or alloy thereof may be expected to have the same effect.

Industrial Applicability

As described above, the electro luminescence devices according to the invention are useful for light emitting diodes, and furthermore, which can be applied to laser diodes or other electro luminescence devices. Particularly, the invention is suited for stable production of electro luminescence devices having superior light emission characteristics by employing a group II–VI compound semiconductor crystal substrate, of which conduction type is difficult to be controlled.

What is claimed is:

1. A method for producing an electro luminescence device, comprising the steps of:
   providing a compound semiconductor crystal substrate comprising a Group 12 (2B) element and a Group 16 (6B) element in a periodic table;
   disposing a diffusion source on a front surface of the substrate, the diffusion source including an element converting the substrate of a p or n conductor into the opposite n or p conductor;
   forming a pn junction by heat treating and thermally diffusing the diffusion source; and
   forming electrodes on front and rear of the substrate;
   wherein the diffusion source disposed on the front surface of the substrate includes at least one of silicon and carbon, and comprises at least one of Cl, Br, I or alloy thereof.

2. The method for producing an electro luminescence device as claimed in claim 1, wherein the defect compensating the impurity level which is formed in the substrate by the element included in the diffusion source, is a vacancy or a defect including the vacancy.

3. The method for producing an electro luminescence device as claimed in claim 1, wherein the diffusion source disposed on the front surface of the substrate comprises an element such that Gibbs' free energy of a compound which is formed by combining the diffusion source and impurity is smaller than Gibbs' free energy of a compound which is formed by combining a constitute element in the substrate and the impurity at a diffusion process temperature, or a material including the element.

4. The method for producing an electro luminescence device as claimed in claim 1, wherein the diffusion source is Al, Ga, In or alloy thereof.

5. The method for producing an electro luminescence device as claimed in claim 1, wherein the impurity is at least one of O, Li, Ag, Cu and Au.

6. The method for producing an electro luminescence device as claimed in claim 1, wherein the diffusion source is deposited over the front surface of the substrate under vacuum by any one of a sputtering method, a resistance heating method, and an electron beam method.

7. The method for producing an electro luminescence device as claimed in claim 1, wherein a heat treating temperature at the diffusion is 300° C. to 700° C.

8. The method for producing an electro luminescence device as claimed in claim 1, wherein a thickness of the diffusion source before performing the heat treatment is 1,000 Å to 10,000 Å.

9. The method for producing an electro luminescence device as claimed in claim 8, wherein the diffusion source remains on the front surface of the substrate with a predetermined thickness after the heat treatment.

10. The method for producing an electro luminescence device as claimed in claim 8, wherein a thickness of a remained diffusion source and a diffusion layer is not less than 100 Å.

11. The method for producing an electro luminescence device as claimed in claim 7, wherein the diffusion source is Al or In, and the diffusion source is heat treated on a condition that diffusion time is longer than the one specified by a relational expression $Y=2\times10^5\exp(-0.018T)$, showing a relation between diffusion time Y and a heat treating temperature T.

12. The method for producing an electro luminescence device as claimed in any one of claims 1–4, 5 and 6–11, wherein the substrate is ZnTe.

13. A method for producing an electro luminescence device, comprising the steps of:
   providing a compound semiconductor crystal substrate comprising a Group 12 (2B) element and a Group 16 (6B) element in a periodic table;
   disposing a diffusion source on a front surface of the substrate, the diffusion source including an element converting the substrate of a p or n conductor into the opposite n or p conductor;
   forming a pn junction by heat treating and thermally diffusing the diffusion source; and
   forming electrodes on front and rear of the substrate;
   wherein the diffusion source is disposed on a substrate plane having plane orientation from which a flat plane is obtained after etching, and wherein before the diffusion source is disposed, the front surface of the substrate is chemically etched.

14. The method for producing an electro luminescence device as claimed in claim 13, wherein the substrate is any one of ZnTe, ZnSe and ZnO.

15. The method for producing an electro luminescence device as claimed in claim 13, wherein the substrate plane having the plane orientation from which a flat plane is able to be obtained after etching is (111)Zn plane, (001) plane, or (011) plane.

16. The method for producing an electro luminescence device as claimed in claim 13, wherein the substrate plane having the plane orientation from which a flat plane is able to be obtained after etching has an inclining angle within 10 degrees from (111)Zn plane, (001) plane, or (011) plane.

17. The method for producing an electro luminescence device as claimed in claim 13, wherein the chemical etching is performed with etchant of bromic acid system or bromine system.

18. A method for producing an electro luminescence device, comprising the steps of:
providing a compound semiconductor crystal substrate comprising a Group 12 (2B) element and a Group 16 (6B) element in a periodic table;
disposing a diffusion source on a front surface of the substrate, the diffusion source including an element converting the substrate of a p or n conductor into the opposite n or p conductor;
forming a pn junction by heat treating and thermally diffusing the diffusion source; and
forming electrodes on front and rear of the substrate;
wherein a film thickness of the diffusion source is from 5 nm to 50 nm.

19. The method for producing an electro luminescence device as claimed in claim 18, wherein a film thickness of the diffusion source is from 5 nm to 20 nm.

20. The method for producing an electro luminescence device as claimed in claim 18, wherein a treating temperature for the thermal diffusion is from 300° C. to 550° C.

21. The method for producing an electro luminescence device as claimed in claim 18, wherein treatment time for the thermal diffusion is determined so as to have such a range that the diffusion source remains in not less than a predetermined thickness after the diffusion process.

22. The method for producing an electro luminescence device as claimed in claim 18, wherein the substrate is any one of ZnTe, ZnSe and ZnO.

23. The method for producing an electro luminescence device as claimed in any one of claim 18 to claim 22, wherein the diffusion source is Al, Ga, In, or alloy thereof.

24. An electro luminescence device comprising a compound semiconductor crystal substrate comprising a Group 12 (2B) element and a Group 16 (6B) element in a periodic table,
wherein the electro luminescence device is produced by disposing a diffusion source including an element converting the substrate of a p or n conductor into the opposite n or p conductor on a front surface of the substrate; forming a pn junction by heat treating and thermally diffusing the diffusion source; forming electrodes on both surfaces of the substrate; and etching the front surface of the substrate before depositing the diffusion source; and wherein
the compound semiconductor crystal substrate has carrier density of from $1 \times 10^{17}$ cm$^{-3}$ to $5 \times 10^{18}$ cm$^{-3}$.

25. The electro luminescence device as claimed in claim 24, wherein the compound semiconductor crystal substrate has desired carrier density by doping determined amount of a Group 15 (5B) element in the periodic table.

26. The electro luminescence device as claimed in claim 24, wherein the substrate is any one of ZnTe, ZnSe and ZnO.

27. The electro luminescence device as claimed in claim 24 or claim 26, wherein the diffusion source is Al, Ga, In, or alloy thereof.

28. An electro luminescence device comprising a compound semiconductor crystal substrate comprising a Group 12 (2B) element and a Group 16 (6B) element in a periodic table,
wherein the electro luminescence device is produced by disposing a diffusion source including an element converting the substrate of a p or n conductor into the opposite n or p conductor on a front surface of the substrate; forming a pn junction by heat treating and diffusing the diffusion source; and forming electrodes on both surfaces of the substrate, and
a depth of the diffusion is not less than 0.3 μm and not more than 2.0 μm from the front surface of the substrate.

29. The electro luminescence device as claimed in claim 28, wherein a luminescence center wavelength is from 550 nm to 570 nm.

30. The electro luminescence device as claimed in claim 28, wherein the substrate is any one of ZnTe, ZnSe and ZnO.

31. The electro luminescence device as claimed in any one of claim 28 to claim 30, wherein the diffusion source is Al, Ga, In, or alloy thereof.

32. The method for producing an electro luminescence device as claimed in claim 8, wherein a thickness of the diffusion source before performing the heat treatment is 1,500 Å to 5,000 Å.

33. The method for producing an electro luminescence device as claimed in claim 10, wherein a thickness of a remained diffusion source and a diffusion layer is not less than 300 Å.

* * * * *